(12) United States Patent
Ho et al.

(10) Patent No.: US 6,724,081 B2
(45) Date of Patent: Apr. 20, 2004

(54) ELECTRONIC ASSEMBLY

(75) Inventors: Kwun-Yao Ho, Taipei (TW); Kung Moriss, Taipei (TW); Lin-Chou Tung, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/151,434

(22) Filed: May 20, 2002

(65) Prior Publication Data

US 2003/0094692 A1 May 22, 2003

(30) Foreign Application Priority Data

Nov. 16, 2001 (TW) .................. 90219742 U (51) Int. Cl.[7] .................. H05K 1/16; H01L 23/34; H01L 23/48; H01L 23/10
(52) U.S. Cl. .................. 257/718; 257/726; 257/727; 257/712; 257/737; 257/738; 257/778
(58) Field of Search .................. 257/718, 737, 257/738, 778, 727, 726, 685, 712

(56) References Cited

U.S. PATENT DOCUMENTS 6,507,104 B2 * 1/2003 Ho et al. .................. 257/712
2002/0046856 A1 * 4/2002 Alcoe .................. 174/52.1
2003/0000739 A1 * 1/2003 Frutschy et al. .................. 174/260
2003/0045028 A1 * 3/2003 Tsao et al .................. 438/108

* cited by examiner

Primary Examiner—Alexander Oscar Williams (57) ABSTRACT

A replaceable integrated circuit device which replaces the connecting socket, the interposer and the pins in prior art with plural solder balls on the bottom of the integrated circuit package contacting and connecting the corresponding contact pad on the circuit board for electrical conduction. The contacting surface of the solder balls and the corresponding contact pad can be made as plane or as curve as possible to increase the contacting area. More over, there are many buckling apparatus placed on the circuit board to buckle the integrated circuit package and the circuit board firmly and to provide the extra downward force to make the solder balls and the corresponding contact pad contact and connect each other tightly. In the present invention, for the solder balls contacting the contact pads of the circuit board directly, which reduce the space that a connecting socket used in prior art and improve the usage ratio of the layout on a circuit board.

9 Claims, 7 Drawing Sheets

ELECTRONIC ASSEMBLY

BACKGROUND OF THE INVENTION (a) Field of the Invention

The present invention relates to a replaceable integrated circuit (IC) device. Especially, the present invention relates to a replaceable integrated circuit device which enables an electronic board and an integrated circuit package to connect each other without pin on the integrated circuit package and any socket between the integrated circuit package and the circuit board, but still keep good electrical conduction and mechanical stability.

(b) Description of the Prior Arts

For long time in prior art, there are two basic methods to place integrated circuit package (IC package) on circuit board (or main board). One is to solder firmly the integrated circuit package on the circuit board but the integrated circuit package is not replaceable. The other method is that the integrated circuit package is replaceable by using a socket or a connector, so, the integrated circuit package can be replaced when necessary. Most of time, replaceable integrated circuit package is used when the circuit board need to be upgraded, the integrated circuit package itself need to be replaced or in some cases that need expensive integrated circuit package device. The replaceable integrated circuit package device is used when one of the devices on circuit board is broken or need to be replaced but the rest of the components on the board still in good condition, the computer's CPU (Central Processing Unit) is a best example.

Figure 1:
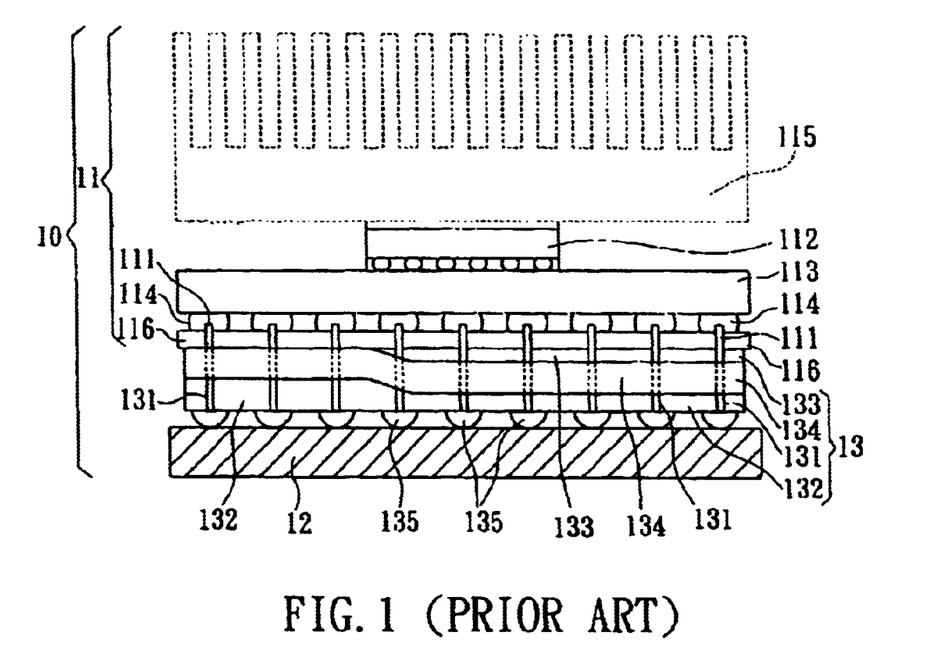
FIG. 1 shows the side view of a conventional replaceable integrated circuit device in prior art.
Figure 2:
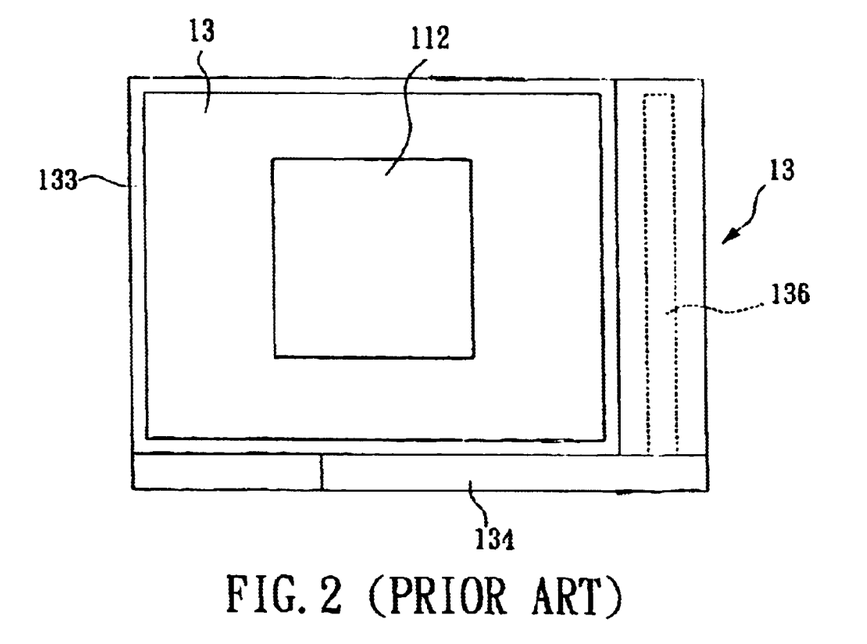
FIG. 2 shows the top view of a conventional replaceable integrated circuit device in prior art.

Please refer to FIG. 1 and FIG. 2, which showing a conventional replaceable integrated circuit device 10 in prior art. In prior art, an integrated circuit device 11 has pins 111, and the circuit board 12 has a socket 13 with many pin holes 131 in order to connect each other in better electrical condition. There are two basic methods to seal down the integrated circuit device 11, one is called lead frame and the other is ball grid array (BGA). In recent years, another method called flip chip BGA packaging is used more often in sealing high-numbered pins integrated circuit package. FIG. 1 shows the basic components which comprising a integrated circuit chip 112 placed on one side of the substrate 113 by flip chip method. Several solders 114 are placed on the other side of the substrate 113, which connecting the integrated circuit chip 112 and the substrate 113. The other side of the integrated circuit chip 112 has a heat sink 115. For the pins 111 is not hard enough, and it is easy to be broken during swap. And for the pins 111 is not easy to connect the solder 114 firmly, so, before being soldered to the solder 114, it has to be placed on a interposer 116 with modeling technology. Doing so only enlarge the thickness of the integrated circuit device 11, which against the trend of small-thin style in modern electronic industry.

In order to provide the function, the pins 111 of the integrated circuit device 11 will be placed. The socket 13 in prior art comprises a socket base 132 with a plurality of holes 131 soldered on the circuit board 12, a sliding board 133 placed on the top of the socket base 132 which can slide linearly and a long levering bar 134 placed aside the socket base 132 to be used to move the sliding board 133 in a micro manner. Every hole 131 in the socket base 132 has metal clip slice for electrical conduction. In the bottom of the holes 131, there are tiny tin balls for soldering purpose, which also providing the function of electrical conduction to the circuit board 12. A bigger hole is placed on the corresponding location of sliding board 133 to the holes 131, and by pushing down the long levering bar 134 rotating along with the axle 136 till reaching as horizontal level as the socket base 132 will move the sliding board in a small manner and make the pins 111 of the integrated circuit device 11 be held tightly in the holes 131. When removing the integrated circuit device 11, the long levering bar 134 will be move until reach the vertically position with the socket base 132. However, the way of swap the integrated circuit device in prior art has many disadvantages as follows:

(1) Not easy to swap. The pins 111 are plural and tiny, and it is so easy to be damaged during swap.

(2) The pins 111 are easy to be bended and broken, when the pins 111 bended, the integrated circuit device 11 will not be used any more.

(3) The cost is relatively higher; the extra interposer 116 and the pins 111 should be placed on the integrated circuit device 11 and the complex socket 13 should be placed on the circuit board 12; and that need more cost.

(4) The integrated circuit device 11 is thicker and heavier. Placing the extra interposer 116 and the pins 111 on the integrated circuit device 11 and the complex socket 13 on the circuit board 12 will increase the thickness and weight of the integrated circuit device 11.

(5) The space occupied is bigger. The socket 13 needs extra space to hold the long levering bar 134 and the axle 136.

(6) The electric capacity effect is higher. The pins 111 and the holes 131 placed between the integrated circuit chip 112 and the circuit board 12, which increasing the so-called electric capacity effect.

SUMMARY OF THE INVENTION

The present invention relates to a replaceable integrated circuit device. Especially, the present invention relates to a replaceable integrated circuit device which enable a electronic board and a integrated circuit package to connect each other without pin and socket, but still keep good electrical conduction and mechanical stability.

In one aspect of the present invention is that said invention provides a replaceable integrated circuit device which is not easy to be broken when swap, with relatively lower cost, thinner and lighter, less space occupied and better electrical effect.

In another aspect of the present invention is that said invention provides a replaceable integrated circuit device which replace the connecting socket, the interposer and the pins in prior art with plural solder balls on the bottom of the integrated circuit package connecting the corresponding pad on the circuit board to conduct electricity.

The third aspect of the present invention is that said invention provides a replaceable integrated circuit device which replace the sliding board, the long levering bar and the axel in prior art with a new buckle apparatus to connect the integrated circuit package and the circuit board.

In order to achieve the above purpose, the present invention is that said invention provides a replaceable integrated circuit device which replacing the connecting socket, the interposer and the pins in prior art with plural solder balls on the bottom of the integrated circuit package connecting the corresponding contact pad on the circuit board to conduct electricity. The contacting surface of the solder balls and the corresponding contact pad can be made as plane or as curve as possible to increase the contacting area to provide good electrical conduction and mechanical stability. More over, there are many buckling apparatus placed on the circuit board to buckle the integrated circuit package and the circuit board firmly and to provide the extra downward force to make the solder balls and the corresponding contact pad contact each other tightly. When removing the integrated circuit package from the circuit board, just release the buckling apparatus. With present invention, there are many advantages as follows, the integrated circuit package is easy to swap but not easy to be damaged for it has no pins with it, the manufacturing cost is lower, the thickness and the weight is relatively less and lower.

The appended drawings will provide further illustration of the present invention, together with the description, serve to explain the principles of the invention.

DETAILED DESCRIPTION OF THE PRESENT INVENTION

The present invention relates to a replaceable integrated circuit device. Especially, the present invention relates to a replaceable integrated circuit device which is featured with plural contacting pads placed on the circuit board instead of using the pins and socket technology in prior art. Nor the present invention is using the interposer and the pins used in prior art but using plural solder balls on the bottom of the integrated circuit package that contacting the corresponding contact pads on the circuit board to conduct electricity. The contacting surface of the solder balls and the corresponding contact pads can be made as plane or as curve as possible to increase the contacting area. More over, there are many buckling apparatus placed on the circuit board to buckle the integrated circuit package and the circuit board firmly and to provide the extra downward force to make the solder balls and the corresponding contact pad contact each other tightly. When removing the integrated circuit package from the circuit board, just release the buckling apparatus. With present invention, there are many advantages as follows, the integrated circuit package is easy to swap but not easy to be damaged for it has no pins with it, the manufacturing cost is lower, the thickness and the weight is relatively less and lower which totally correct the disadvantages seen in prior art.

The following embodiments will illustrate detail information of the operation, the method, the effect of the replaceable integrated circuit device of the present invention.

In order to explain more detail about the features and the embodiment of the present invention, the follows will introduce a couple of embodiments of the replaceable integrated circuit device of the present invention.

Figure 3:
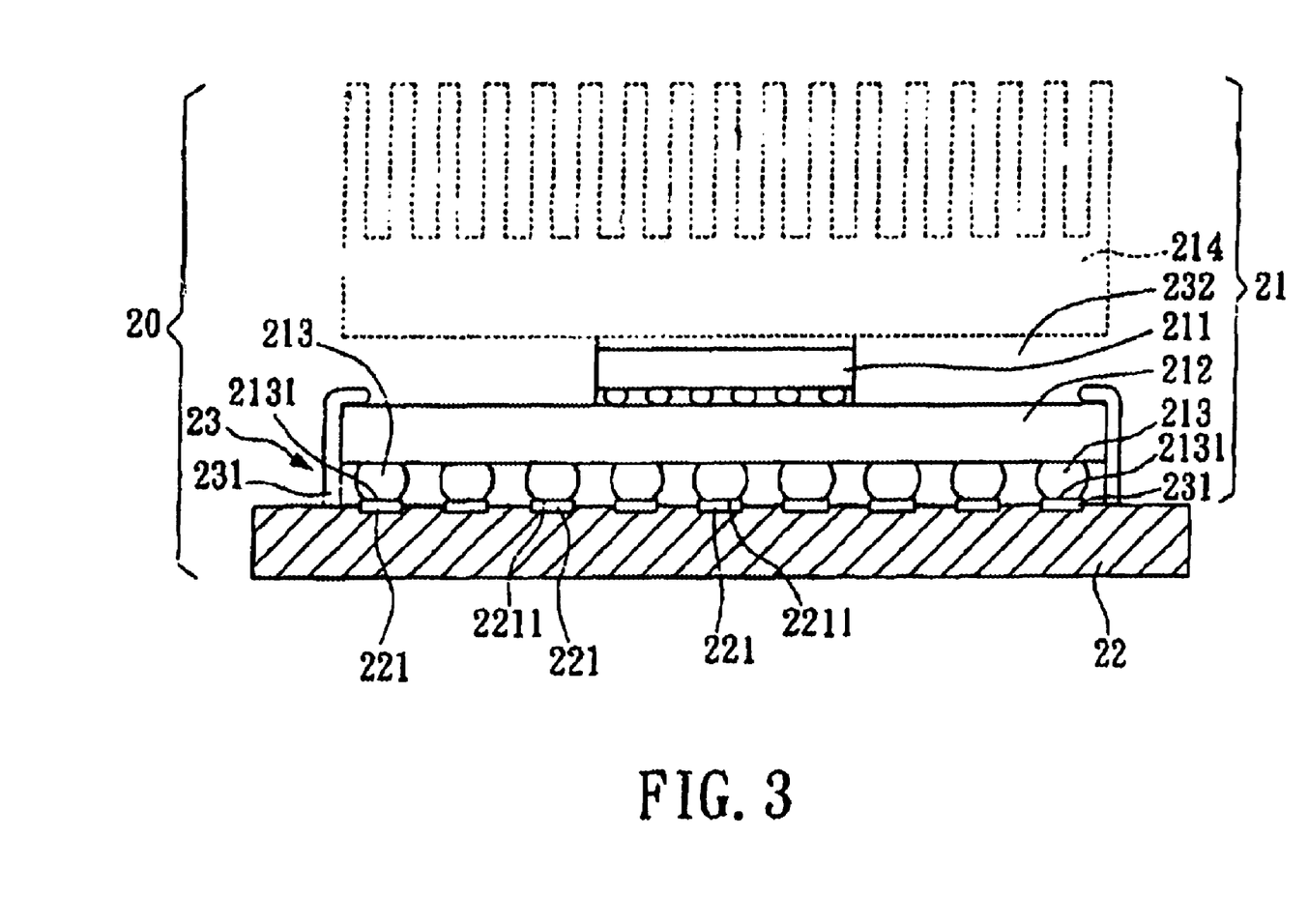
FIG. 3 shows the side view of the first preferred embodiment of the present invention of a replaceable integrated circuit device.

As shown in FIG. 3, which is the first embodiment of the replaceable integrated circuit device 20 of the present invention. As shown, the replaceable integrated circuit device 20 comprises two independent components the integrated circuit package 21 and the circuit board 22.

Said integrated circuit package 21 comprises an integrated circuit chip 211 and a substrate 212 with circuit layout. Said substrate 212 has some solder balls 213 on the bottom; said solder balls 213 connect electrically the active side of said integrated circuit chip 211; the other side of said integrated circuit chip 211 has a heat sink 214 to cool heat. In the embodiment, said integrated circuit chip 211 is a conventional flip chip BGA component, however, it could be other BGA component such as wire bond or tape automated bonding (TAB). In this preferred embodiment, another method has been adapted by the present invention which is a extra process called coining which applied to the bottom 2131 of said solder balls 213. The details will be described later.

On the surface of said circuit board 22, there are some contact pads 221 made of conduct material; around said contact pads 221, some buckle apparatus 23 have been placed. It will be better if the material of said contact pads 221 is nickel, gold, chromium, copper, iron, aluminum, titanium, lead, tin or other alloy. Said contact pads 221 are exposed and have contact with the corresponding solder balls 213 of said integrated circuit package 21. Said contact pads 221, just like said solder balls 213, are arranged as an array on said circuit board 22 to form a rectangle contacting area. Said buckle apparatus 23 comprises some buckle components 231, each of said buckle components 231 is placed firmly on said circuit board 22 and is on the proper location around said rectangle contacting area. Substantially, said buckle components 231 of said buckle apparatus 23 forms an open structure 232. The size of said open structure 232 is about equivalent to that of said substrate 212, so, said integrated circuit package 21 can be placed into said buckle components 231 thru said open structure 232. Said buckle components 231 provide a buckling function to said substrate 212, when said solder balls 213 contacting said contact pads 221, to assure said solder balls 213 and said contact pads 221 to connect firmly and correctly. In this preferred embodiment, the top plane 2211 of said contact pads 221 is horizontal; meanwhile, the bottom plane 2131 of said solder balls 213 is horizontal. Therefore, said solder balls 213 and said contact pads 221 connected together firmly; the contacting area is bigger and the electrical conductivity is better. To have better effect, anti-oxidized process, such as nickel-plating or other plating method, can be applied to the surface of said solder balls 213 to prevent oxidization problem.

Also, for said solder balls 213 contacting said contact pads 221 of said circuit board 22 directly, which reduce the space that a connecting socket used in prior art and improve the usage ratio of the layout on said circuit board 22. And because said solder balls 213 of said integrated circuit package 21 and said contact pads 221 of said circuit board 22 are more plane and smooth, which enable said integrated circuit package 21 and said circuit board 22 to connect firmly.

Certainly, said circuit board 22 can have other electronic components than said contact pads 221 and said buckle apparatus 23 of the present invention, but it is not the area this specification covers.

Figure 4:
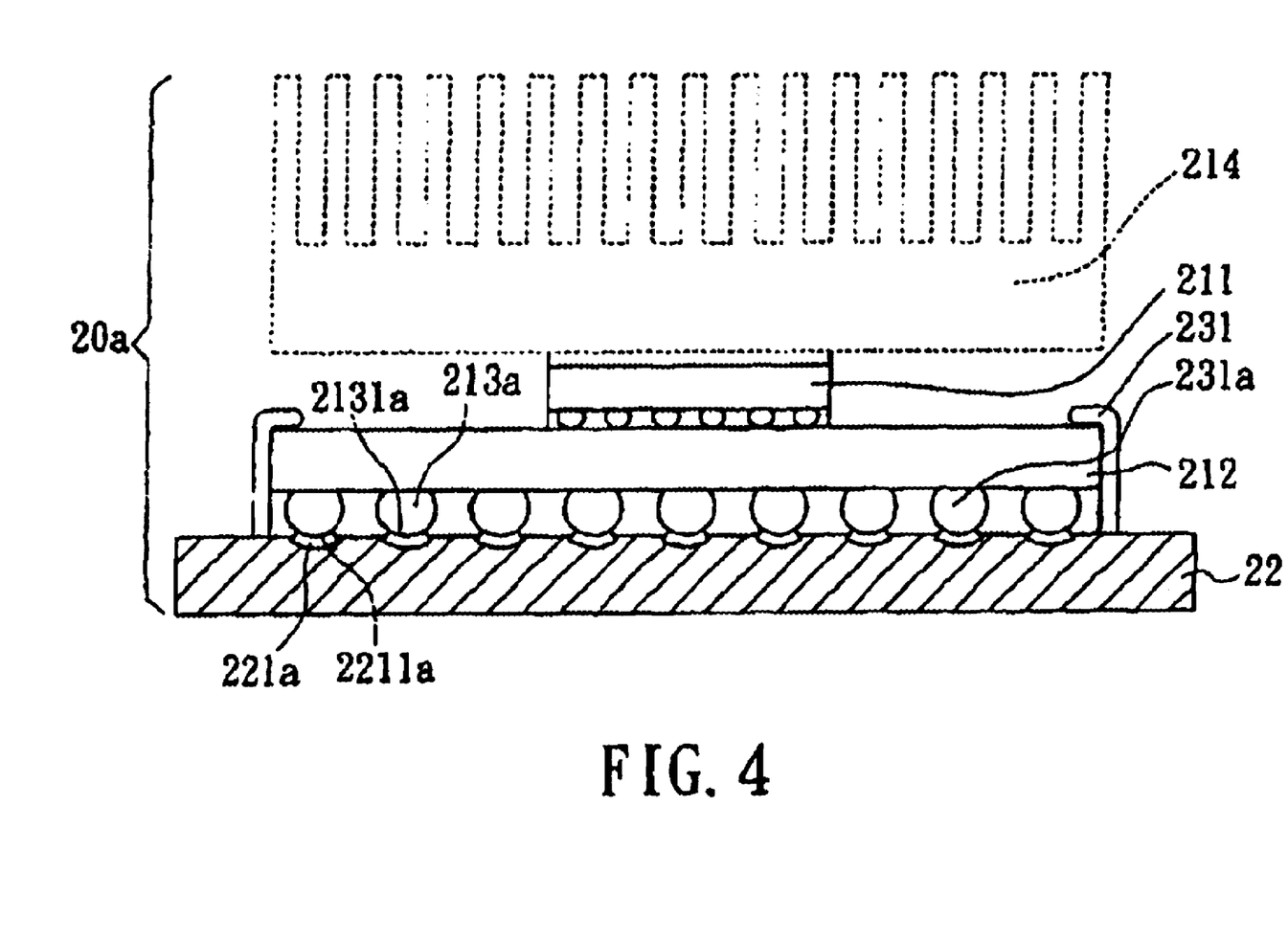
FIG. 4 shows the side view of the second preferred embodiment of the present invention of a replaceable integrated circuit device.

Please refer to FIG. 4, which is the second preferred embodiment of the replaceable integrated circuit device 20a of the present invention. Most components in this embodiment are similar to the components in the FIG. 3 except that some top plane 2211a of the contact pads 221a are concave curve-shaped, which matching the curve-shaped bottom 2131a of the solder balls 213a, therefore, the coining can be removed from the process but still keep the two components connected together tightly.

Figure 5:
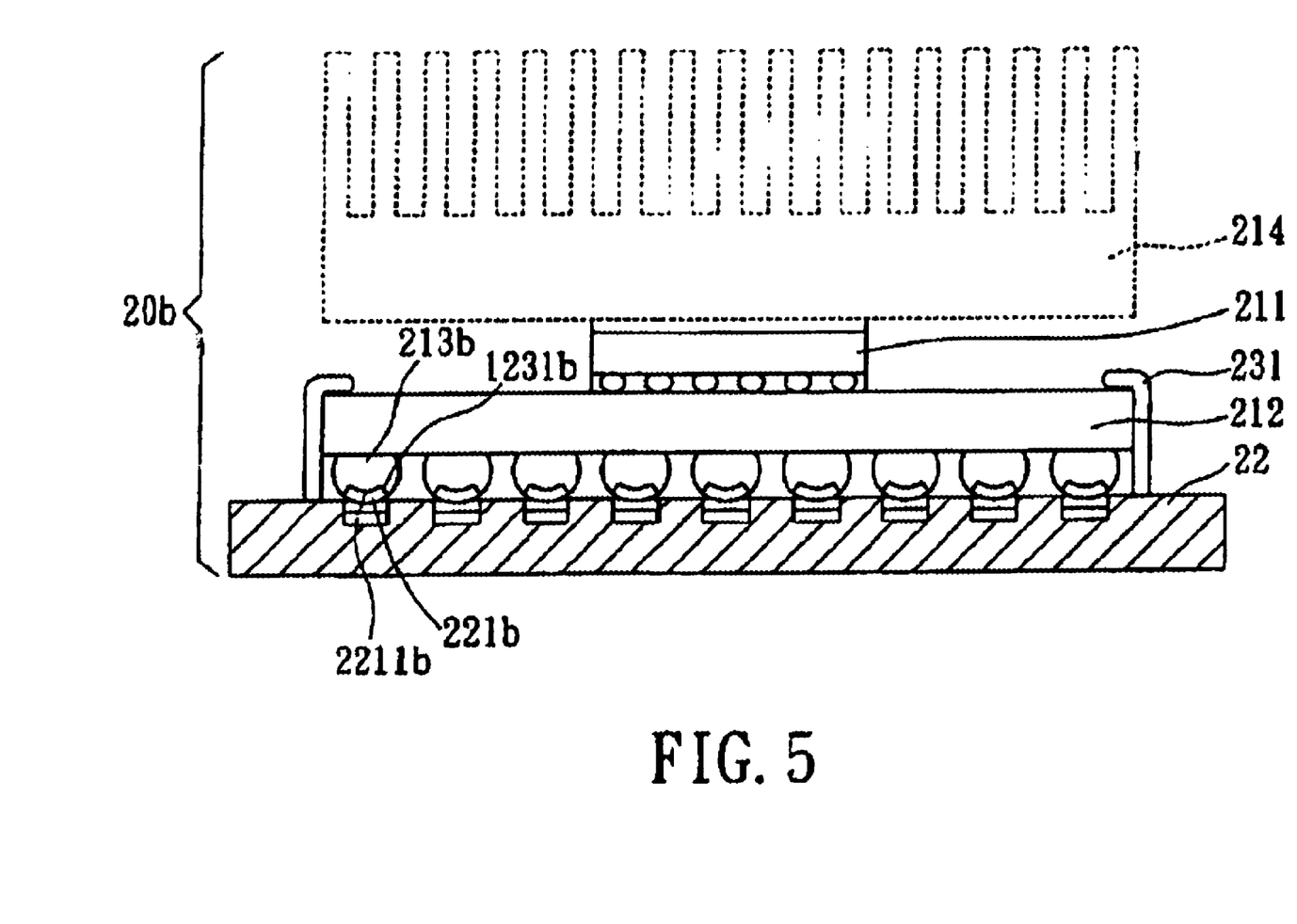
FIG. 5 shows the side view of the third preferred embodiment of the present invention of a replaceable integrated circuit device.

Please refer to FIG. 5, which is the third preferred embodiment of the replaceable integrated circuit device 20b of the present invention. Most components in this embodiment are similar to the components in the FIG. 3 except that some top plane 2211b of the contact pads 221b are convex wave-curve-shaped, which matching the wave-curve-shaped bottom 2131b of the solder balls 213b and increasing the contacting area between two components.

Figure 6A:
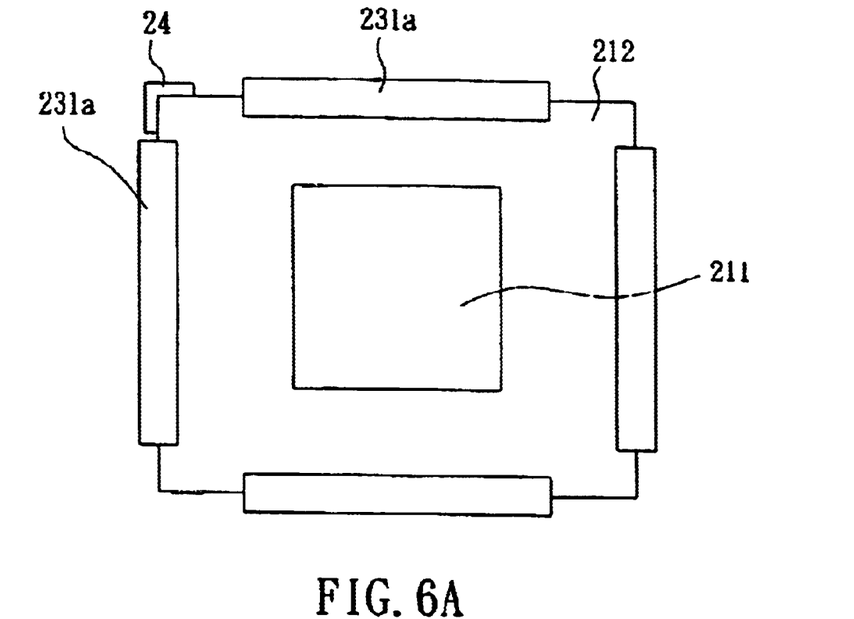
FIG. 6A shows a embodiment of the relative location of the buckle apparatus, the stop block and the substrate of the integrated circuit package of the present invention.
Figure 6B:
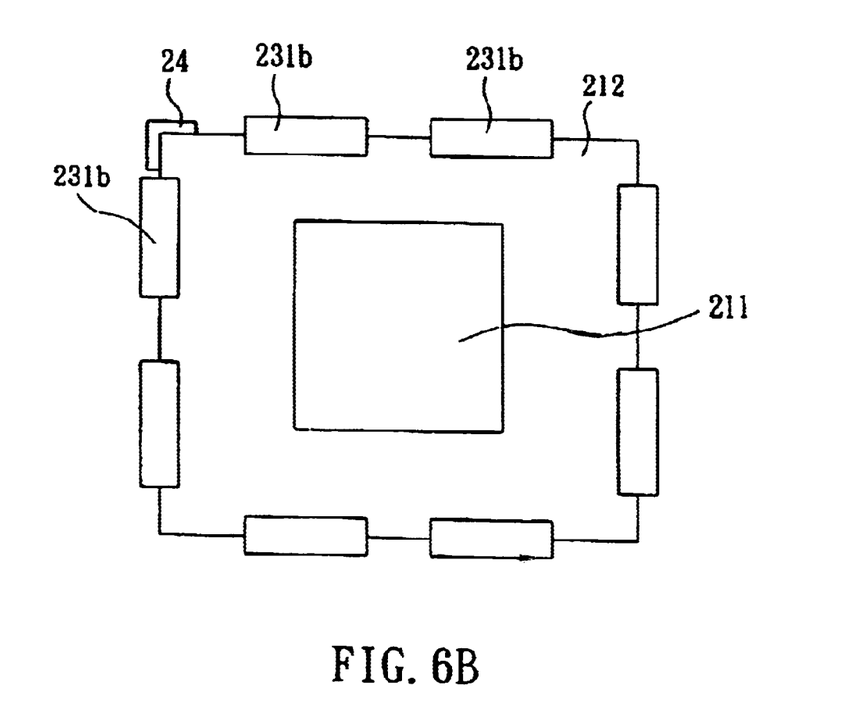
FIG. 6B shows another embodiment of the relative location of the buckle apparatus, the stop block and the substrate of the integrated circuit package of the present invention.

Said buckle apparatus 23 of the present invention comprises several buckle components 231, said buckle components 231 can be 4 long strip ones 231a, as shown in FIG. 6A, placed around said rectangle substrate 122 or 8 short narrow strip ones 231b or other shape ones. In FIGS. 6A and 6B, on a pre-determined place, corresponding to said substrate 212, of the circuit board, a protruding L-shaped stop block 24 can be placed, with said protruding L-shaped stop block 24, the solder balls can be aligned and will contact the corresponding contact pads correctly. Said long strip ones 231a and said short narrow strip ones 231b are independent components and placed around said substrate 122, but, of cause, the buckle components can be a single extension of said substrate 122 placed around it.

Figure 7A:
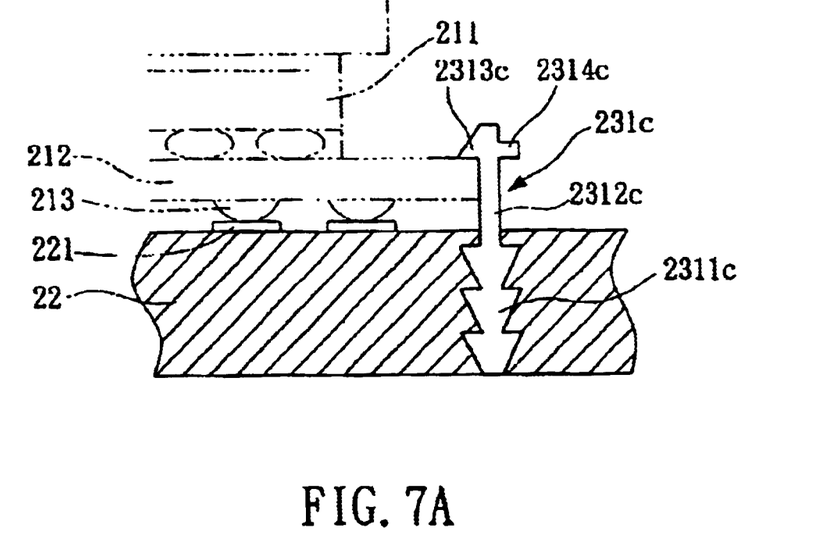
FIG. 7A shows the first embodiment of the buckle apparatus of the present invention.

As shown in FIG. 7A, each buckle component 231c of the buckle apparatus comprises a base 2311c, a body 2312c, a hook 2313c and a levering bar 2314c. Said base 2311c is placed firmly on said circuit board 22 by molding, plugging, welding, gluing, surface mount technology or any other conventional technology. More, said base 2311c can penetrate said circuit board 22 to connect said circuit board 22 or just connects said circuit board 22 thru its surface, or in between. When necessary, the surface of said base 2311c can be made into saw-tooth shape to increase the conduction. The one end of said body 2312c is a vertical extension of said base 2311c with proper height. Said proper height is about equivalent to total height of said substrate 212 and said solder ball 213. Said hook 2313c is on another end of said body 2312c and is with proper distance form said circuit board 22, said hook 2313c is protruding a proper extension along the direction of said contact pad 221 going, when said solder ball 213 contacting the corresponding contact pad 221c, said hook 2313c can hook the rim of said substrate 212 to protect said substrate 212 from drop or shift from the original position. Said levering bar 2314c is placed on another side of said body 2312c opposite to said hook 2313c; moving said levering bar 2314c outward will bend said body 2312c outward and make said hook 2313c move away from said contact pad 221, and further, cause said hook 2313c unhook said rim of said substrate 212, therefore, said integrated circuit package 21 leave apart from said circuit board.

Figure 7B:
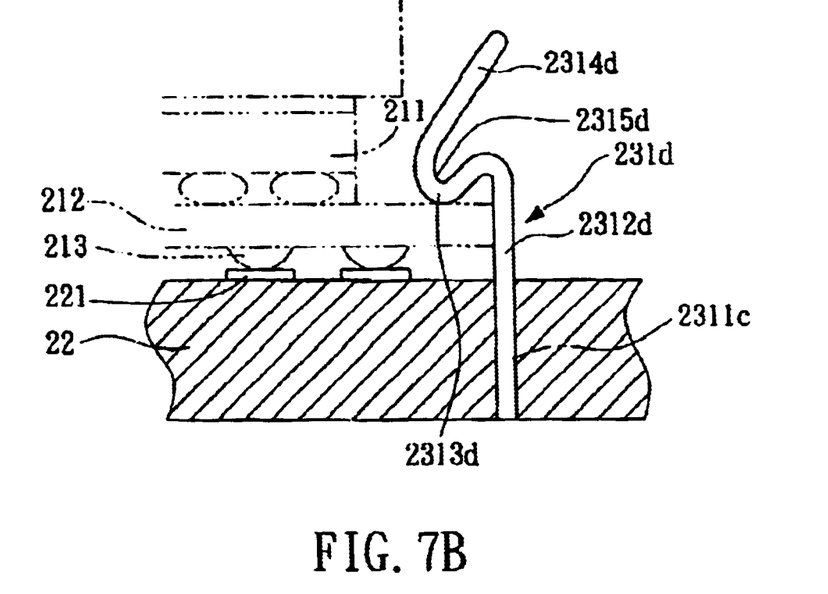
FIG. 7B shows the second embodiment of the buckle apparatus of the present invention.

Please refer to FIG. 7B, which is the second preferred embodiment of the buckle component 231d of a buckle apparatus. Said buckle component 231d comprises a base 2311d, a body 2312d, a hook 2313d and a levering bar 2314d. In this embodiment, it will be better if said buckle component 231d is made by flexible steel material, such as engineering plastic or metal material, with modeling technology. Meanwhile, said hook 2313d can be made into a S-shaped spring component 2315d to provide spring force. In this embodiment, the distance between the rim of said S-shaped spring component 2315d and said circuit board 22 can be a little less than the total height of said substrate 212 and said solder ball 213 to provide a proper force applying downward.

Figure 7C:
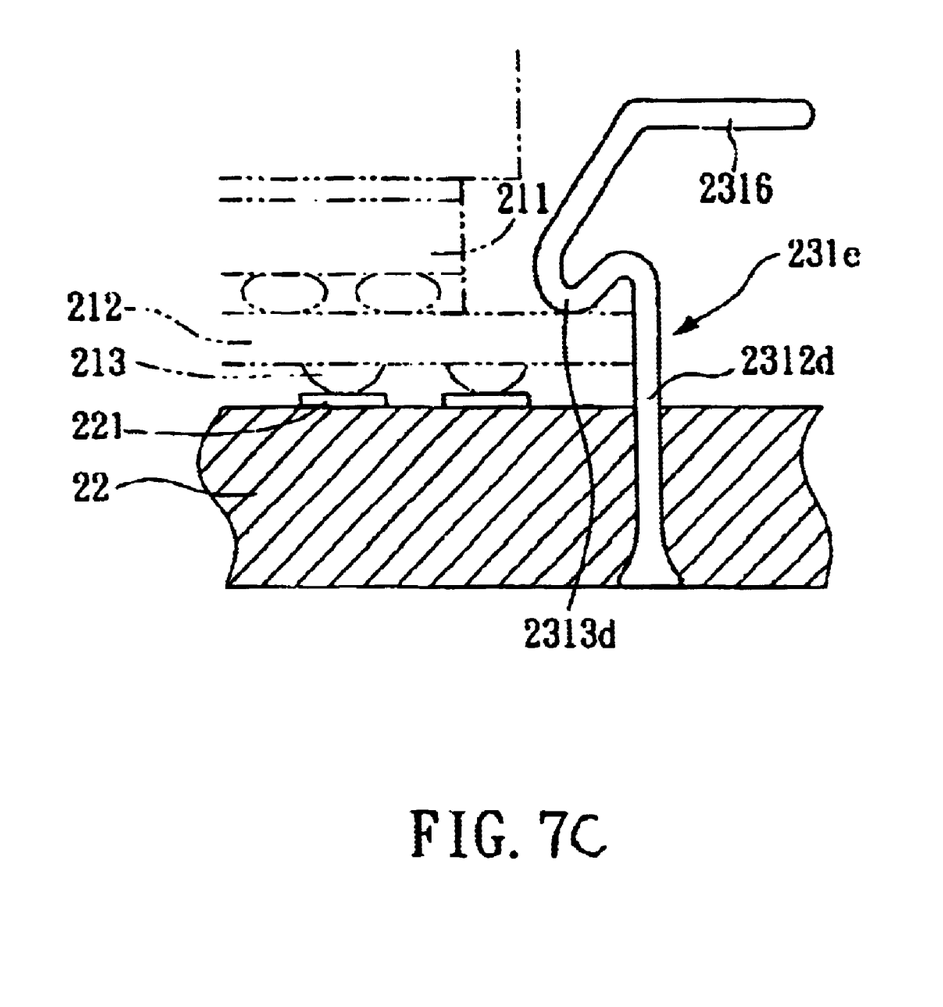
FIG. 7C shows the third embodiment of the buckle apparatus of the present invention.

Please refer to FIG. 7C, which is the third preferred embodiment of the buckle component 231e of a buckle apparatus. Most of the components in FIG. 7C are similar to FIG. 7B except there is a horizontal extension 2316 on the levering bar for convenience.

Comparing with the conventional replaceable pin-and-socket integrated circuit device, the present invention is easy to operate, just placing the solder balls of the integrated circuit package toward the corresponding contact pad of the circuit board and buckling the buckle apparatus to make said solder balls contact said contact pad connect firmly will complete the whole connecting operation. And, when removing said integrated circuit package from said circuit board, just releasing the buckle components on said buckle apparatus.

Concluding the above descriptions, the present invention at least has the advantages as follows;

(1) Easy to swap. No pins are used; pin is easy to be damaged during swap.
(2) The cost is relatively lower, there is no extra interposer and pins should be placed on the integrated circuit device and there is no complex socket placed on the circuit board. Therefore, the cost is lower.
(3) The integrated circuit device is thinner and lighter. Since no extra interposer and pins placed on the integrated circuit device, and there is no complex socket on the circuit board, the integrated circuit device is thinner and lighter.
(4) Save space. No extra space needed for a long levering bar and the axle.
(5) The electric capacity effect is lower. The solder balls contact the corresponding contact pads, the so-called electric capacity effect is relatively lower.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

What is claimed is:

1. An electronic assembly for housing an integrated circuit package comprising:
   a circuit board having a plurality of contact pads on one side, said contact pads being exposed and arranged as a plane contact area to contact and connect electrically to said integrated circuit package;
   a buckle apparatus placed on the circuit board at a location around said plane contact area to form an open area for holding the integrated circuit package, wherein, when said integrated circuit package contacts said plane contact area, said buckle apparatus provides a buckling function to assure that said integrated circuit package is fixed on the circuit board correctly;

wherein said buckle apparatus comprises at least one buckle component which is placed on an extension area of said contact area, said buckle component having the following which are all made from one piece;

a base which is fired to, and extends inside, the circuit board;

a body having a first end and a second end the first end being a vertical extension of the base; and a hook provided on the second end of the body and which extends toward the contact area.

2. The assembly of claim 1, wherein top surface of said contact pad is curve-shaped.

3. The assembly of claim 1, wherein a plurality of predetermined curve-shaped protruding area is formed on each top surface of said contact pads.

4. An electronic assembly, comprising:

an integrated circuit package which comprises an integrated circuit chip and a substrate with electrical circuit layout, some solder balls being placed on said substrate, said solder balls connecting electrically to said integrated circuit chip via said electrical circuit layout;

a circuit board having a plurality of contact pads formed on one side thereof, said contact pads being exposed and directly contacting some corresponding solder balls of said integrated circuit package such that there are no intermediate elements between each set of contacting contact pad and solder ball;

a buckle apparatus placed on circuit board and on a location around said contact pads to form a frame-shaped open area for holding the integrated circuit package, with the size of said open area being about equivalent to the size of the substrate, wherein said buckle apparatus provides a buckling function to said substrate to assure that said solder balls and said contact pads are connected correctly.

5. The assembly of claim 4, wherein the top surface of said contact pads is made into a curved shape and the bottom surface of said solder ball is also made into a curved shape to match said corresponding curved shape of said contact pads.

6. The assembly of claim 4, wherein some protruding areas are formed on the top surface of said contact pads and the bottom surface of said solder balls is curved to match said protruding areas.

7. The assembly of claim 4, wherein the substrate has a rim, and wherein said buckle apparatus comprises at least one buckle component that comprises:

a base which is fixed to, and extends inside, the circuit board;

a body having a first end and a second end, the first end being a vertical extension of said base along the direction toward circuit board with a proper height, with the proper height being equivalent to the total height of the substrate and the solder ball;

a hook provided on the second end of the body and which extends toward the contact area such that when said solder ball contacts said contact pad, said hook buckles the rim of said substrate to prevent said substrate from dropping.

8. The assembly of claim 4, wherein a protruding stop block is placed on said circuit board such that said solder balls will be positioned and aligned according to their corresponding contact pad.

9. The assembly of claim 1, wherein said contact pads directly contact some corresponding solder balls of said integrated circuit package such that there are no intermediate elements between each set of contacting contact pad and solder ball.

* * * * *